(12) United States Patent
Sasaki

(10) Patent No.: US 7,855,125 B2
(45) Date of Patent: Dec. 21, 2010

(54) METHOD FOR MANUFACTURING SEMICONDUCTOR DEVICE AND SEMICONDUCTOR DEVICE

(75) Inventor: Takaoki Sasaki, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 135 days.

(21) Appl. No.: 12/038,044

(22) Filed: Feb. 27, 2008

(65) Prior Publication Data

US 2008/0224234 A1    Sep. 18, 2008

(30) Foreign Application Priority Data

Mar. 16, 2007    (JP) .............................. 2007-068961

(51) Int. Cl.
*H01L 27/088*    (2006.01)
*H01L 21/76*    (2006.01)

(52) U.S. Cl. ............... 438/424; 257/408; 257/E21.129; 257/E29.263; 438/435; 438/437; 438/522

(58) Field of Classification Search .............. 257/408, 257/296, 392, 314, 347, 321, 319, 324, 499, 257/632, E29.263, E21.422, E21.682, E27.103, 257/E21.103, E21.619, E21.626, E29.628, 257/E29.345, E27.016, E21.429; 438/257, 438/437, 424, 427, 239, 151, 279, 302, 522, 438/435

See application file for complete search history.

(56) References Cited

U.S. PATENT DOCUMENTS

| | | | |
|---|---|---|---|
| 6,268,266 B1 * | 7/2001 | Hwang et al. | 438/439 |
| 2002/0185693 A1 * | 12/2002 | Yasuda et al. | 257/392 |
| 2003/0222318 A1 * | 12/2003 | Tanaka et al. | 257/406 |

FOREIGN PATENT DOCUMENTS

| | | |
|---|---|---|
| JP | A-2002-009144 | 1/2002 |
| JP | A-2006-339501 | 12/2006 |

* cited by examiner

*Primary Examiner*—Victor A Mandala
*Assistant Examiner*—Whitney Moore
(74) *Attorney, Agent, or Firm*—Oliff & Berridge, PLC

(57) ABSTRACT

A method for manufacturing a semiconductor device includes: forming a groove in a semiconductor substrate and embedding an element isolation film made of a silicon oxide film in the groove; forming a silicon nitride film on the element isolation film; forming an oxidized silicon nitride film on the surface of the element isolation film through thermal treatment of the element isolation film and the silicon nitride film; and removing the silicon nitride film.

5 Claims, 8 Drawing Sheets

METHOD FOR MANUFACTURING SEMICONDUCTOR DEVICE AND SEMICONDUCTOR DEVICE

The entire disclosure of Japanese Patent Application No. 2007-068961, filed Mar. 16, 2007 is expressly incorporated by reference herein.

BACKGROUND

1. Technical Field

The present invention relates to a method for manufacturing a semiconductor device and to a semiconductor device in which an element isolation film is embedded in a silicon substrate. In particular, the invention relates to a method for manufacturing a semiconductor device and to a semiconductor device which, in the etching process of a silicon oxide film subsequent to formation of an element isolation film, can suppress a surface of the element isolation film from being etched.

2. Related Art

FIGS. 7A to 7C and 8A are sectional views for explaining a related method for manufacturing a semiconductor device. FIG. 8B is a sectional view of the semiconductor device taken along plane A-A' in the state as shown in FIG. 8A. The semiconductor device manufactured according to the method shown by these diagrams has a first transistor located in a first element region 100c and a second transistor located in a second element region 100d. A gate insulating film 103d of the second transistor is thicker than a gate insulating film 103c of the first transistor.

First, as shown in FIG. 7A, a groove is formed in a silicon substrate 100. Next, a thermally-oxidized film 102a is formed on the side surface and the bottom surface of the groove. Further, an element isolation film 102 is embedded in the groove. The element isolation film 102 is a silicon oxide film which is formed by vapor-phase synthesis method. The element isolation film 102 separates the first element region 100c and the second element region 100d respectively from other regions. Next, the silicon substrate 100 is thermally oxidized. As a result of this, the gate insulating film 103d is formed in a second element region 100d, and a thermally-oxidized film 103a is formed in the first element region. In the state as shown in this diagram, the gate insulating film 103d does not have the necessary thickness.

Next, as shown in FIG. 7B, a resist film 150 is formed on and around the silicon substrate 100 located in the second element region, and wet etching is performed using the resist film 150 as a mask. As a result of this, the thermally-oxidized film 103a is removed. In this process, the surface of the element isolation film 2 located around the first element region is etched, and a concave section 102b is formed in the silicon substrate 100 located around the first element region (see JP-A-2002-9144 (sixth paragraph) is an example of related art).

Subsequently, as shown in FIG. 7C, the resist film 150 is removed. Next, the silicon substrate 100 is thermally oxidized. As a result of this, the gate insulating film 103c is formed in the first element region, and the thickness of the gate insulating film 103d increases to the necessary thickness.

Next, as shown in each of FIGS. 8A and 8B, a gate electrode 104c, a side wall 105c, a low-concentration impurity region 106c and an impurity region 107c which serves as source and drain of the first transistor are formed. At the same time, a gate electrode 104d, a side wall 105d, a low-concentration impurity region 106d, and an impurity region 107d which will serve as source and drain of the second transistor are formed.

As described in the example of related art, the concave section 102b is formed in the first element region. Accordingly, a section located on the concave section 102b is thinner compared to other sections in the gate insulating film 103c of the first transistor. As a result, a threshold voltage of the first transistor drops in the section located on the concave section 102b.

In the case of a structure in which an element isolation film is embedded in a semiconductor substrate as described above, when the surface of the element isolation film is etched in the etching process of a silicon oxide film which is performed subsequent to formation of the element isolation film, a concave section located around the element isolation film is formed in the semiconductor substrate. Accordingly, a threshold voltage of a transistor drops in the section located on the concave section.

SUMMARY

An advantage of the invention is to provide a method for manufacturing a semiconductor device, which, in the etching process of a silicon oxide film subsequent to formation of an element isolation film, can suppress the surface of the element isolation film from being etched.

According to a first aspect of the invention, a method for manufacturing a semiconductor device includes: forming a groove in a semiconductor substrate and embedding an element isolation film made of a silicon oxide film in the groove; forming a silicon nitride film on the element isolation film; forming an oxidized silicon nitride film on the surface of the element isolation film through thermal treatment of the element isolation film and the silicon nitride film; and removing the silicon nitride film.

According to the first aspect of the invention, the oxidized silicon nitride film is formed on the surface of the element isolation film. Accordingly, in the etching process of a silicon oxide film subsequent to formation of the element isolation film, the method can suppress the surface of the element isolation film from being etched.

In this case, in embedding the element isolation film, a first element region in which a first transistor is formed and a second element region in which a second transistor having a higher drive voltage than the first transistor is formed may be separated from each other. The method may further include subsequent to removing the silicon nitride film: forming a gate insulating film of the second transistor on the silicon substrate located in the second element region and forming a thermally-oxidized film on the silicon substrate located in the first element region through thermal oxidation of the surface of the silicon substrate; removing the thermally-oxidized film by wet etching; and increasing the thickness of the gate insulating film of the second transistor located in the second element region and forming a gate insulating film of the first transistor on the silicon substrate located in the first element region, through thermal oxidation of the surface of the silicon substrate.

A method for manufacturing a semiconductor device according to a second aspect of the invention includes: forming a groove in a silicon substrate and embedding an element isolation film made of a silicon oxide film formed by a vapor-phase synthesis method in the groove; forming a thermally-oxidized film on the surface of the silicon substrate; forming a silicon nitride film on the thermally-oxidized film and on the element isolation film; forming an oxidized silicon nitride film on the surface of the element isolation film through thermal treatment of the element isolation film and the silicon nitride film; and removing the silicon nitride film.

In this case, in embedding the element isolation film, a first element region in which a first transistor is formed and a second element region in which a second transistor having a higher drive voltage than the first transistor is formed may be separated from each other. The method may further include: subsequent to removing the silicon nitride film, removing the thermally-oxidized film; forming a gate insulating film of the second transistor on the silicon substrate located in the second element region and forming a second thermally-oxidized film on the silicon substrate located in the first element region through thermal oxidation of the surface of the silicon substrate; removing the second thermally-oxidized film by wet etching; and increasing the thickness of the gate insulating film of the second transistor located in the second element region and forming a gate insulating film of the first transistor on the silicon substrate located in the first element region, through thermal oxidation of the surface of the silicon substrate.

A method for manufacturing a semiconductor device according to a third aspect of the invention includes: separating a first element region in which a MONOS nonvolatile memory is formed from other regions, by forming a groove in a silicon substrate and embedding an element isolation film made of a silicon oxide film formed by vapor-phase synthesis method in the groove; forming a thermally-oxidized film on the surface of the silicon substrate; forming a silicon nitride film and a second silicon oxide film on the thermally-oxidized film and on the element isolation film in this order; forming an oxidized silicon nitride film on the surface of the element isolation film through thermal treatment of the element isolation film and the silicon nitride film; and forming a storage section of the MONOS nonvolatile memory in the first element region, by removing the silicon nitride film and the second silicon oxide film which are located on the element isolation film and by selectively removing a laminated film consisting of the thermally-oxidized film, the silicon nitride film and the second silicon oxide film which are located on the silicon substrate.

In this case, in embedding the element isolation film, a second element region in which a first transistor is formed and a third element region in which a second transistor having a higher drive voltage than the first transistor is formed may be respectively separated from other regions. In this case, the method may further include, subsequent to removing the silicon nitride film: forming a gate insulating film of the second transistor on the silicon substrate located in the third element region and forming a second thermally-oxidized film on the silicon substrate located in the second element region through thermal oxidation of the surface of the silicon substrate; forming a mask film on the storage section; removing the second thermally-oxidized film by wet etching using the mask film as mask; removing the mask film; and increasing the thickness of the gate insulating film of the second transistor and forming a gate insulating film of the first transistor on the silicon substrate located in the second element region, through thermal oxidation of the surface of the silicon substrate.

In this case, the method may further include: between embedding the element isolation film and forming the silicon nitride film, thermal treating the element isolation film in an atmosphere containing ammonium.

A semiconductor device according to a fourth aspect of the invention includes: an element isolation film which is embedded in a silicon substrate and which separates an element region from other regions; and a transistor which is formed in the element region. The element isolation film includes a silicon oxide film and an oxidized silicon nitride film located on the surface of the silicon oxide film, and the oxidized silicon nitride film has the highest nitrogen concentration on the surface thereof.

A semiconductor device according to a fifth aspect of the invention includes: an element isolation film which is embedded in a silicon substrate and which separates a first element region and a second element region respectively from other regions; a first transistor which is formed in the first element region; and a second transistor which is formed in the second element region and which has a thicker gate insulating film than the first transistor. The element isolation film includes a silicon oxide film and an oxidized silicon nitride film located on the surface of the silicon oxide film, and the oxidized silicon nitride film has the highest nitrogen concentration on the surface thereof.

A semiconductor device according to a sixth aspect of the invention includes: an element isolation film which is embedded in a silicon substrate and which separates a first element region, a second element region and a third element region respectively from other regions; a MONOS nonvolatile memory which is formed in the first element region; a first transistor which is formed in the second element region; and a second transistor which is formed in the third element region and which has a thicker gate insulating film than the first transistor. The element isolation film includes a silicon oxide film and an oxidized silicon nitride film located on the surface of the silicon oxide film, and the oxidized silicon nitride film has the highest nitrogen concentration on the surface thereof.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will now be described with reference to the drawings. FIGS. 1A to 1D and FIG. 2A are sectional views for explaining a method for manufacturing a semiconductor device according to a first embodiment of the invention. FIG. 2B is a sectional view of the semiconductor device in the state as shown in FIG. 2A cut along plane A-A'. In the semiconductor device manufactured by the present embodiment, a silicon oxynitride layer is formed on the surface of each element isolation film 2 embedded in a silicon substrate 1.

Figure 1A:
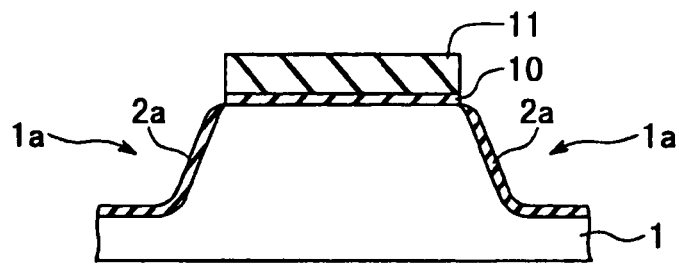
FIGS. 1A to 1D are sectional views for explaining a method for manufacturing a semiconductor device according to a first embodiment.
Figure 2A:
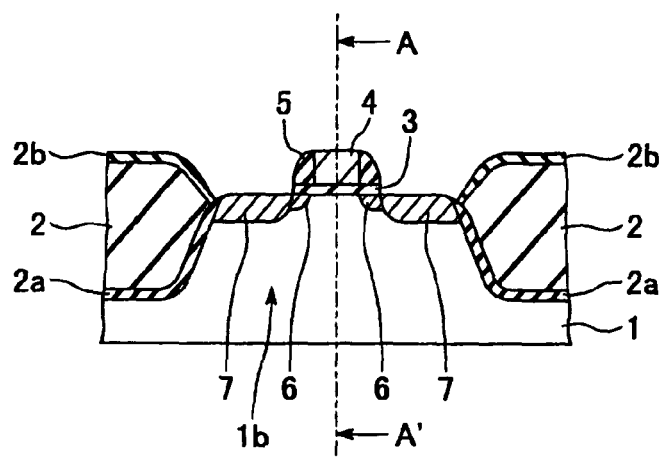
FIG. 2A is a sectional view for explaining the process subsequent to the processes of FIG. 1.
Figure 2B:
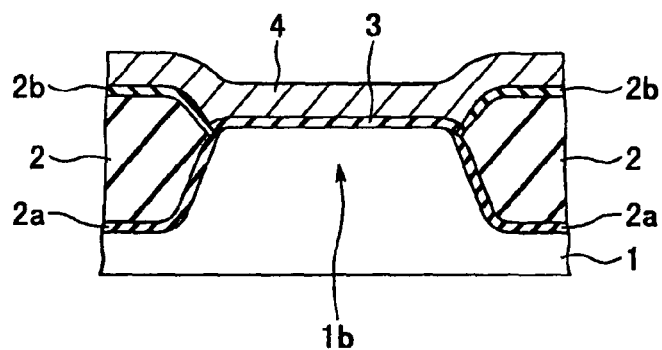
FIG. 2B is a sectional view of the semiconductor device shown in FIG. 2A cut along plane A-A'.

First, as shown in FIG. 1A, a pad oxide film 10 is formed on the silicon substrate 1 by thermal oxidation method. Next, a silicon nitride film 11 is formed on the pad oxide film 10. Next, a resist pattern (which is not shown) is formed on the silicon nitride film 11, and the silicon nitride film 11 is etched using the resist pattern as mask. As a result of this, an opening pattern is formed on the silicon nitride film 11. Subsequently, the resist pattern is removed.

Next, the pad oxide film 10 is etched using the silicon nitride film 11 as mask. Further the silicon substrate 1 is etched using the silicon nitride film 11 as mask. As a result of this, a groove 1a is formed in the silicon substrate 1. Next, the silicon substrate 1 is selectively thermally oxidized using the silicon nitride film 11 as mask. As a result of this, a thermally-oxidized film 2a is formed in the bottom surface and the side wall of the groove 1a.

Figure 1B:
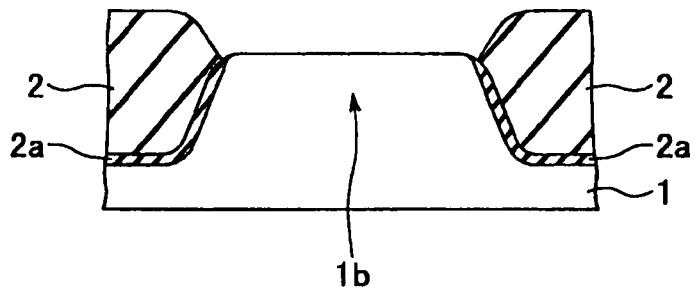

Next, as shown in FIG. 1B, a silicon oxide film is formed in the groove 1a and on the silicon nitride film 11 by CVD method. Next, the silicon oxide film located on the silicon nitride film 11 is removed by CMP method. As a result of this, the element isolation film 2 is embedded in the groove 1a, and an element region 1b in which a transistor is formed is separated from other regions. Subsequently, the silicon nitride film 11 and the pad oxide film 10 are removed by wet etching.

Figure 1C:
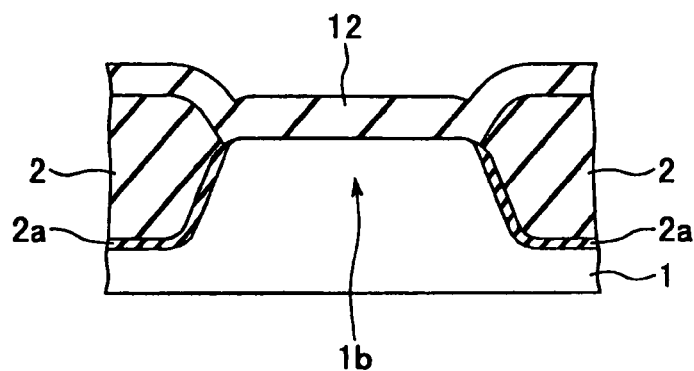

Next, as shown in FIG. 1C, a silicon nitride film 12 is formed on the silicon substrate 1 and on the element isolation film 2 by CVD method. The thickness of the silicon nitride film 12 is, for example, not smaller than 2 nm and not greater than 10 nm.

Figure 1D:
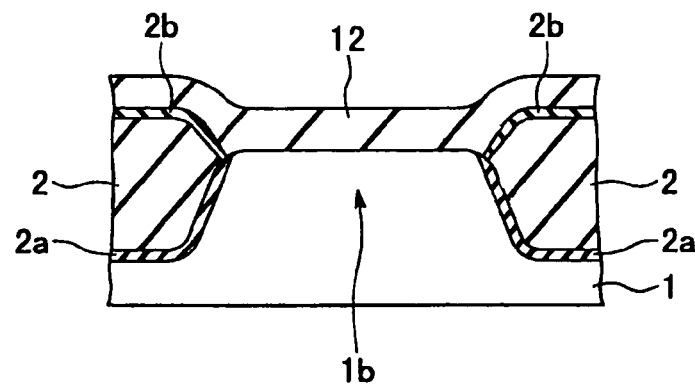

Next, as shown in FIG. 1D, the silicon nitride film 12, the element isolation film 2 and the silicon substrate 1 are thermally treated in nitrogen atmosphere or in oxidizing atmosphere. The thermal treatment temperature at this time is not lower than 650° C. and not higher than 900° C. As a result of this, a part of nitrogen contained in the silicon nitride film 12 diffuses and penetrates into the surface of the element isolation film 2, and a silicon oxynitride layer 2b (oxidized silicon nitride film) is formed on the surface of the element isolation film 2. The nitrogen concentration is the highest on the surface of the silicon oxynitride layer 2b, and the concentration is lower in the center thereof. Since the diffusion speed of nitrogen in the silicon substrate 1 is lower than the diffusion spend of nitrogen in the element isolation film 2 formed by vapor-phase synthesis method, a nitrided layer is not formed on the surface of the silicon substrate 1.

Subsequently, as shown in FIGS. 2A and 2B, the silicon nitride film 12 and the pad oxide film 10 are removed. Next, a sacrificial oxide layer (which is not shown) is formed through thermal oxidation of the silicon substrate 1 located in the element region 1b, and the sacrificial oxide layer is removed by wet etching. As described above, since the silicon oxynitride layer 2b is formed on the surface of the element isolation film 2, the surface of the element isolation film 2 is suppressed from being etched in the process of removing the sacrificial oxide layer. Accordingly, formation of a concave section in the silicon substrate located around the element isolation film 2 is suppressed.

Next, a gate insulating film 3 is formed through thermal oxidation of the silicon substrate 1 located in the element region 1b. Next, a polysilicon film is formed on the gate insulating film 3 and on the element isolation film 2, and the polysilicon film is selectively removed. As a result of this, a gate electrode 4 located on the gate insulating film 3 is formed. Next, an impurity is introduced into the silicon substrate 1 using the gate electrode 4 and the element isolation film 2 as mask. As a result of this, a low-concentration impurity region 6 is formed on the silicon substrate 1 located in the element region 1b. Next, an insulating film is formed on the entire surface including on the gate electrode 4, and the insulating film is etched back. As a result of this, a side wall 5 is formed on the side wall of the gate electrode 4. Next, an impurity is introduced into the silicon substrate 1 using the side wall 5, the gate electrode 4 and the element isolation film 2 as mask. As a result of this, an impurity region 7 which will serve as source and drain is formed on the silicon substrate 1 located in the element region 1b.

In this way, a transistor is formed on the silicon substrate 1.

According to the first embodiment of the invention as described above, the silicon oxynitride layer 2b is formed on the surface of the element isolation film 2 through formation of the silicon nitride film 11 on the element isolation film 2 and diffusion of nitrogen from the silicon nitride film 11 to the surface of the element isolation film 2. Accordingly, the surface of the element isolation film 2 is suppressed from being etched in the process of wet etching the silicon oxide film which is performed subsequent to formation of the element isolation film 2 (for example, in the process of removing the sacrificial oxide layer formed on the silicon substrate 1 by wet etching). As a result, formation of a concave section in the silicon substrate located around the element isolation film 2 is suppressed, and a threshold voltage of the transistor is suppressed from dropping in the section located in the vicinity of the element isolation film 2.

Alternatively, a method of forming a silicon oxynitride layer on the surface of the element isolation film 2 through ion implantation is also conceivable. The nitrogen concentration is the highest in a rather internal section of the silicon oxynitride layer which is formed according to this method. Accordingly) the surface of the silicon oxynitride layer is etched in the process of etching the silicon oxide film. On the other hand, the nitrogen concentration is the highest on the surface of the silicon oxynitride layer 2b which is manufactured by the embodiment. Accordingly, in the process of etching the silicon oxide film, the surface of the silicon oxynitride layer 2b is suppressed from being etched.

Figure 3A:
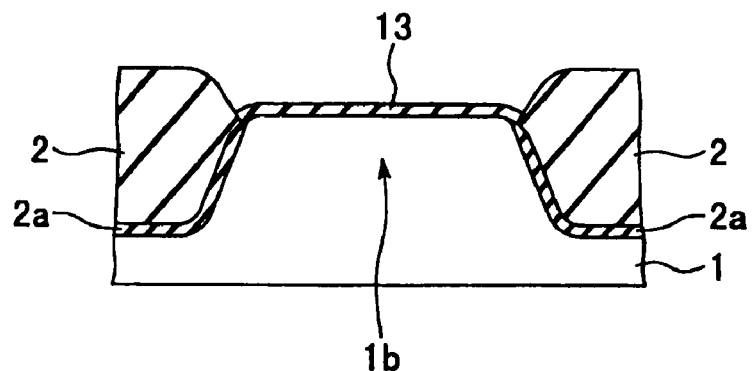
FIGS. 3A to 3D are sectional views for explaining a method for manufacturing a semiconductor device according to a second embodiment.
Figure 3B:
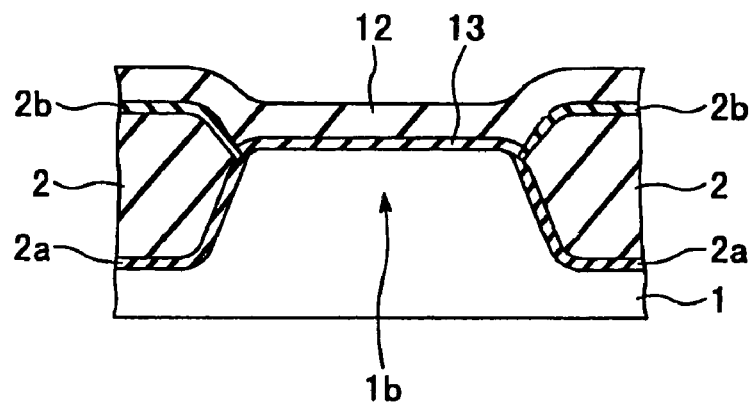
Figure 3C:
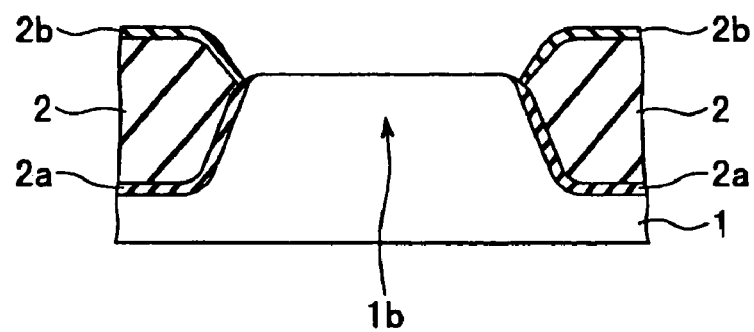

FIGS. 3A to 3C are sectional views for explaining a method for manufacturing a semiconductor device according to a second embodiment of the invention. Hereinafter, identical numerals as those of the first embodiment will be used for structures identical to those of the first embodiment, and the explanation thereof will be omitted.

First, as shown in FIG. 3A, a groove 1a and a thermally-oxidized film 2a are formed on a silicon substrate 1, and an element isolation film 2 is embedded in the groove 1a. These processes are the same as those of the first embodiment. Next, the silicon nitride film 11 and the pad oxide film 10 shown in FIG. 1 are removed, and subsequently the silicon substrate 1 is thermally oxidized. The thermal treatment temperature at this time is not lower than 650° C. As a result of this, a pad oxide film 13 is formed on the silicon substrate 1 located in the element region 1b. The thickness of the pad oxide film 13 is, for example, not less than 1 nm and not more than 5 nm.

Next, as shown in FIG. 3B, a silicon nitride film 12 is formed on the element isolation film 2 and on the pad oxide film 13. Further, a silicon oxynitride layer 2b is formed. The methods of forming the silicon nitride film 12 and the silicon oxynitride layer 2b are the same as those of the first embodiment. Since the diffusion speed of nitrogen in the pad oxide film 13 which serves as the thermally-oxidized film is lower than the diffusion speed of nitrogen in the element isolation film 2 formed by vapor-phase synthesis method, a nitrided layer is not formed on the surface of the silicon substrate 1.

Next, as shown in FIG. 3C, the silicon nitride film 12 and the pad oxide film 13 are removed by wet etching. Since the silicon oxynitride layer 2b is formed on the surface of the element isolation film 2, the surface of the element isolation film 2 can be suppressed from being etched in the process of removing the pad oxide film 13.

Figure 3D:
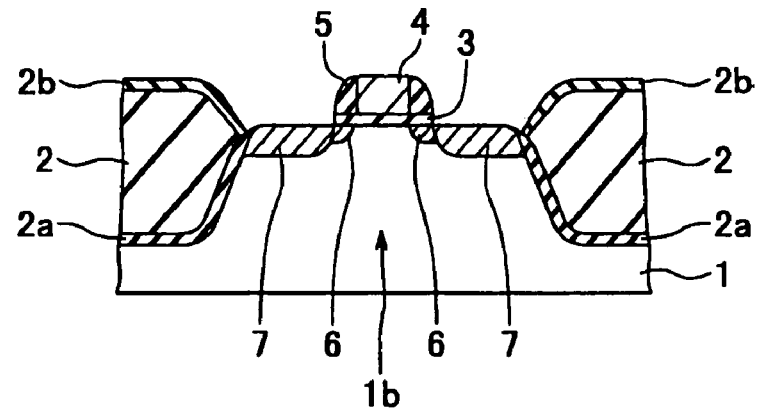

Next, as shown in FIG. 3D, a gate insulating film 3, a gate electrode 4, a side wall 5, a low-concentration impurity region 6 and an impurity region 7 are formed, The methods of forming these are the same as those of the first embodiment.

As described above, the present embodiment can provide the same advantageous effects as the first embodiment. Furthermore, since the pad oxide film 13 is formed between the silicon nitride film 12 and the silicon substrate 1, stress acting on the silicon nitride film 12 can be reduced.

FIGS. 4A to 4C and FIGS. 5A and 5B are sectional views for explaining a method for manufacturing a semiconductor device according to a third embodiment of the invention. The semiconductor device manufactured by the present embodiment has a first transistor in a first element region 1c and has a second transistor in a second element region 1d. The drive voltage of the second transistor is higher than the drive voltage of the first transistor. Accordingly, a gate insulating film 3d of the second transistor is thicker than a gate insulating film 3c of the first transistor. Hereinafter, identical numerals as those of the first embodiment will be used for structures identical to those of the first embodiment, and the explanation thereof will be omitted.

First, as shown in FIG. 1A, a groove 1a and a thermally-oxidized film 2a are formed on a silicon substrate 1, and an element isolation film 2 is embedded in the groove 1a. The methods of forming these are the same as those of the first embodiment. In the present embodiment, the element isolation film 2 separates a first element region 1c and ae second element region 1d respectively from other regions. Next, a silicon nitride film 12 is formed on the element isolation film 2 and on the silicon substrate 1. Further a silicon oxynitride layer 2b is formed on the surface of the element isolation film 2. The methods of forming these are the same as those of the first embodiment.

Figure 4A:
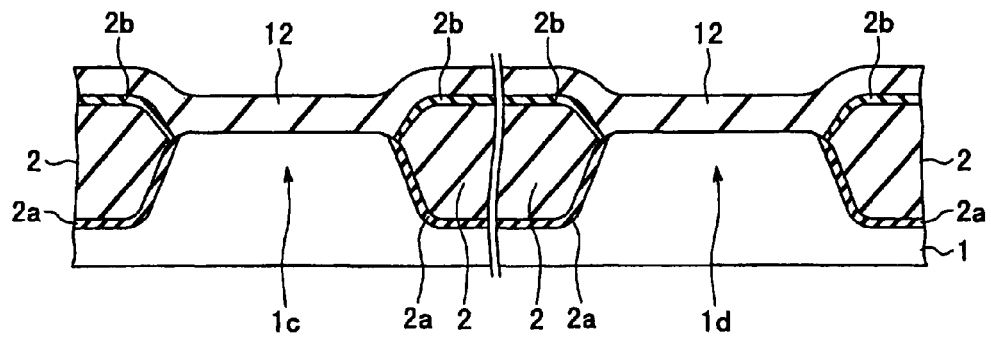
FIGS. 4A to 4C are sectional views for explaining a method for manufacturing a semiconductor device according to a third embodiment.
Figure 4B:
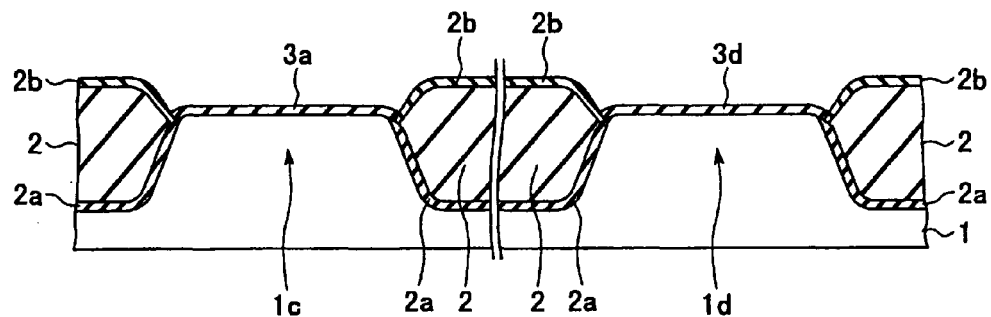

Subsequently, as shown in FIG. 4B, the silicon nitride film 12 is removed. Next, a sacrificial oxide layer (which is not shown) is formed through thermal oxidation of the silicon substrate 1, and the sacrificial oxide layer is removed by wet etching. As described above, since the silicon oxynitride layer 2b is formed on the surface of the element isolation film 2, formation of a concave section in the silicon substrate located around the element isolation film 2 is suppressed.

Next, the silicon substrate 1 is thermally oxidized. As a result of this, the gate insulating film 3d of the second transistor is formed on the silicon substrate 1 located in the second element region 1d, and a thermally-oxidized film 3a is formed on the silicon substrate 1 located in the first element region 1c. The gate insulating film 3d does not have the necessary thickness in the state as shown in this diagram.

Figure 4C:
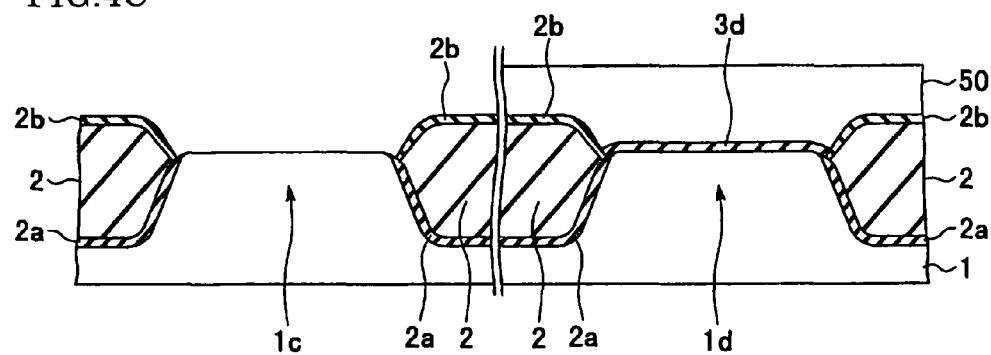

Next, as shown in FIG. 4C, a resist film 50 is formed on the entire surface of the second element region 1d. Next, the silicon oxide film is wet etched using the resist film 50 as mask. As a result of this, the thermally-oxidized film 3a located in the first element region 1c is removed. As described above, the silicon oxynitride layer 2b is formed on the surface of the element isolation film 2. Accordingly, the surface of the element isolation film 2 located around the first element region 1c is suppressed from being etched in the present process. As a result, formation of a concave section in the silicon substrate located around the element isolation film 2 is suppressed in the first element region 1c, and a threshold voltage of the first transistor is suppressed from dropping in a section located in the vicinity of the element isolation film 2.

Figure 5A:
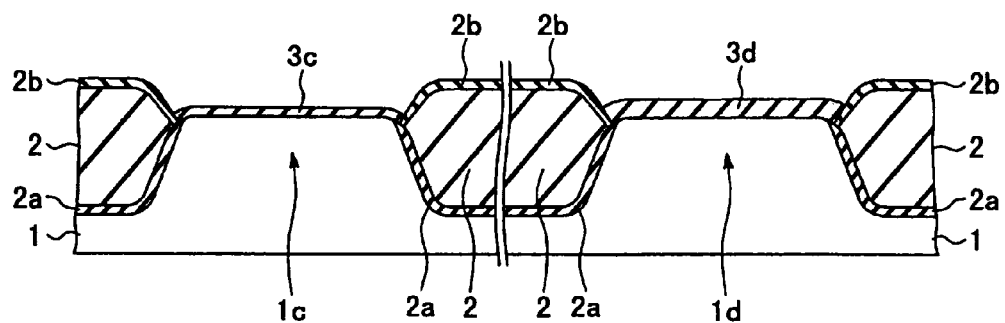
FIGS. 5A and 5B are sectional views for explaining the process subsequent to the processes of FIG. 4.

Subsequently, as shown in FIG. 5A, the resist film 50 is removed. Next, the silicon substrate 1 is thermally oxidized. As a result of this, the gate insulating film 3c is formed on the silicon substrate 1 located in the first element region 1c, and the thickness of the second element region 1d located in the gate insulating film 3d increases to the necessary thickness.

Figure 5B:
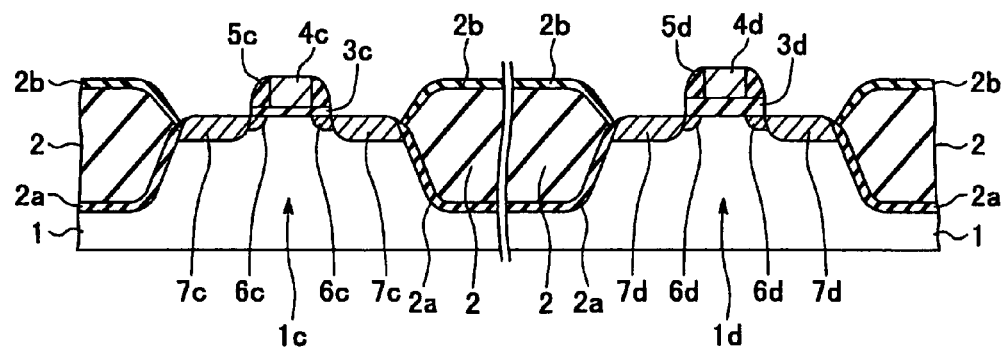

Next, as shown in FIG. 5B, a polysilicon film is formed on the entire surface including on the gate insulating films 3c, 3d and on the element isolation film 2, and then the polysilicon film is selectively removed. As a result of this, a gate electrode 4c located on the gate insulating film 3c and a gate electrode 4d located on the gate insulating film 3d are formed. Next, an impurity is introduced into the silicon substrate 1 using the gate electrodes 4c, 4d and the element isolation film 2 as mask. As a result of this, a low-concentration impurity region 6c is formed on the silicon substrate 1 located in the first element region 1c, and a low-concentration impurity region 6d is formed on the silicon substrate 1 located in the second element region 1d. Next, an insulating film is formed on the entire surface including on the gate electrodes 4c, 4d, and then the insulating film is etched back. As a result of this, side walls 5c, 5d are respectively formed on the side walls of the gate electrodes 4c, 4d. Next, an impurity is introduced into the silicon substrate 1 using the side walls 5c, 5d, the gate electrodes 4c, 4d and the element isolation film 2 as mask. As a result of this, a impurity region 7c which will serve as source and drain of the first transistor is formed on the silicon substrate 1 located in the first element region 1c, and an impurity region 7d which will serve as source and drain of the second transistor is formed on the silicon substrate 1 located in the second element region 1d.

In this way, the first and second transistors are formed on the silicon substrate 1.

According to the third embodiment of the invention as described above, the silicon oxynitride layer 2b is formed on the surface of the element isolation film 2. Accordingly, the surface of the element isolation film 2 located around the first element region 1c is suppressed from being etched in the process of removing the sacrificial oxide layer. In addition, the surface of the element isolation film 2 located around the first element region 1c is suppressed from being etched also in the process of removing the thermally-oxidized film 3a. As a result, formation of a concave section on the silicon substrate 1 located around the element isolation film 2 is suppressed in the first element region 1c. Therefore, the threshold voltage of the first transistor is suppressed from dropping in the section located in the vicinity of the element isolation film 2.

In the present embodiment, as is the case with the second embodiment, the silicon oxynitride layer 2b may be formed using a pad oxide film 13 (as shown in FIG. 3).

Figure 6A:
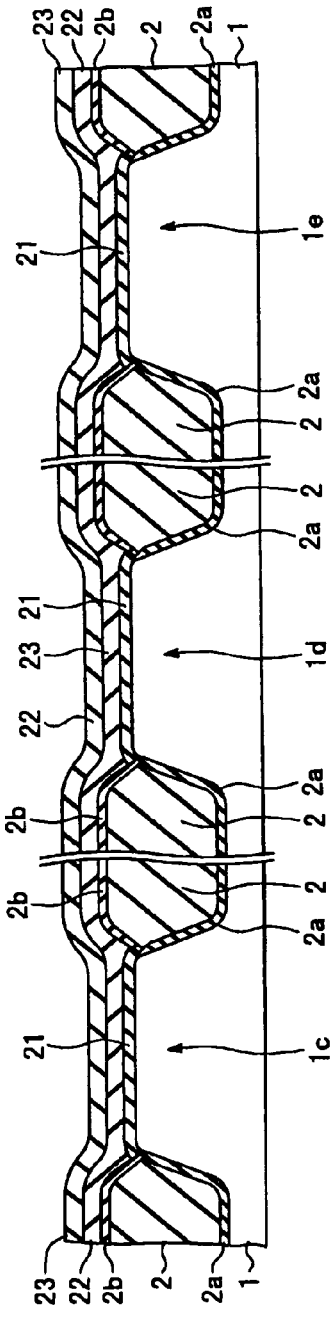
FIGS. 6A to 6C are sectional views for explaining a method for manufacturing a semiconductor device according to a fourth embodiment.
Figure 6B:
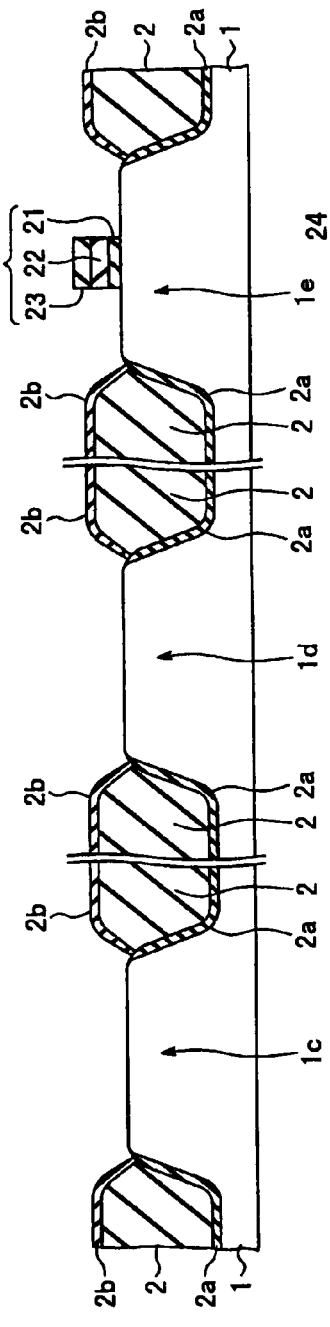
Figure 6C:
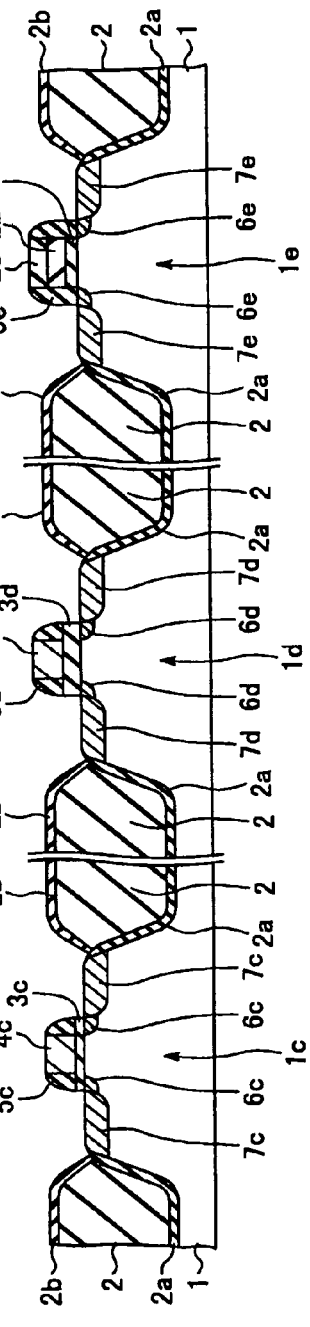
Figure 7A:
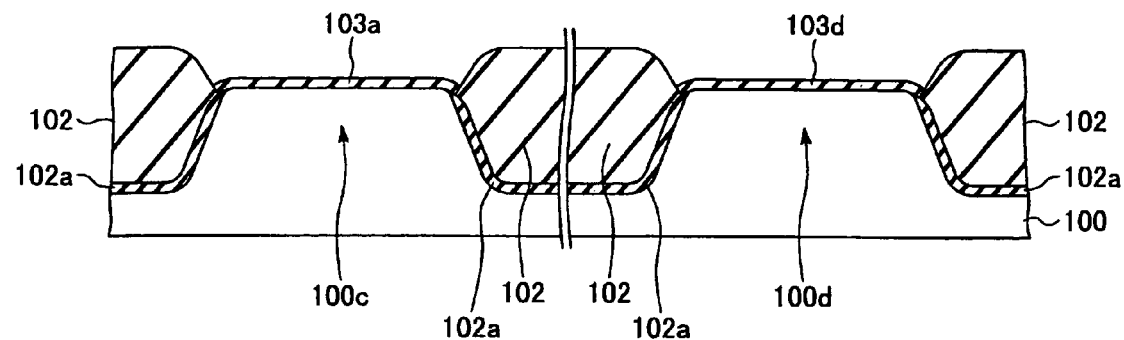
FIGS. 7A to 7C are sectional views for explaining a method for manufacturing a semiconductor device according to a related art.
Figure 7B:
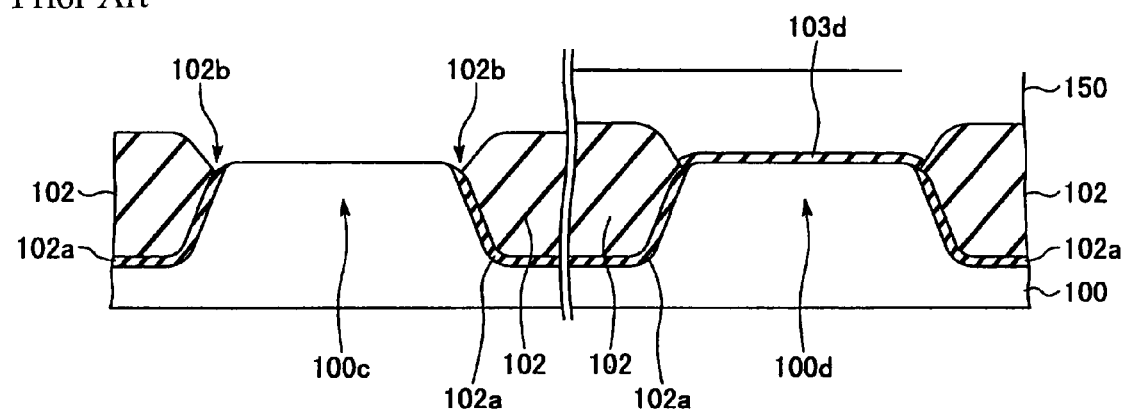
Figure 7C:
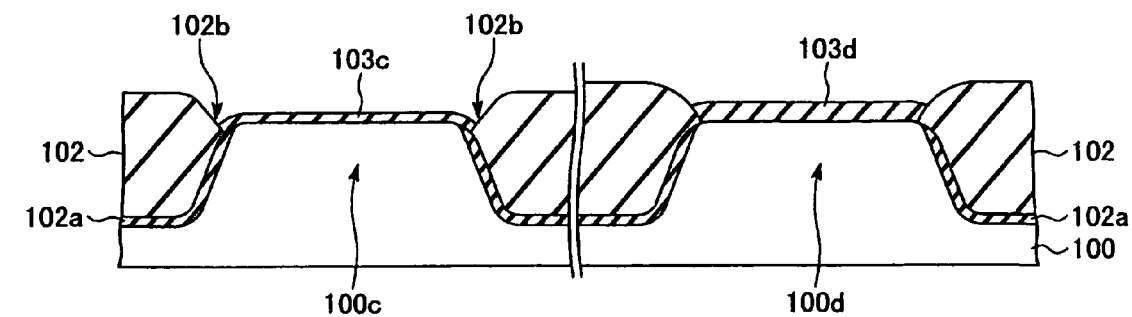
Figure 8A:
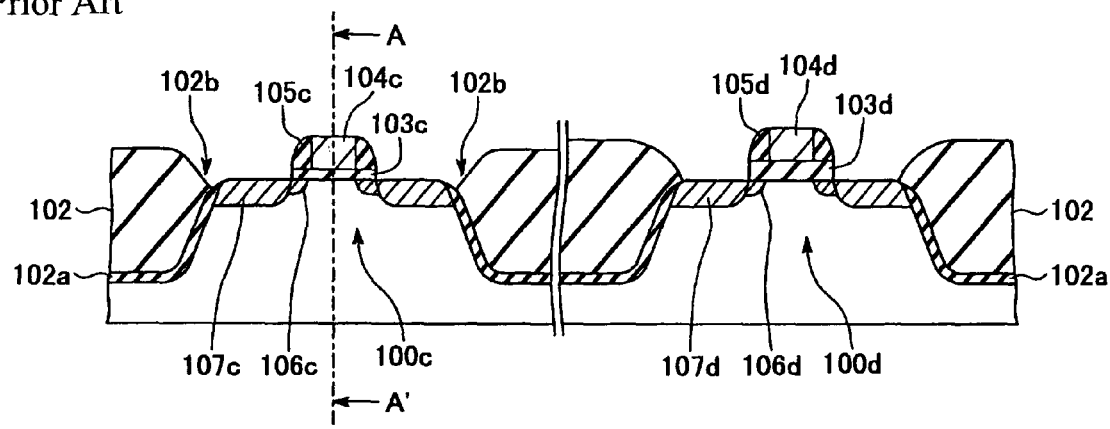
FIG. 8A is a sectional view for explaining the process subsequent to the processes of FIG. 7.
Figure 8B:
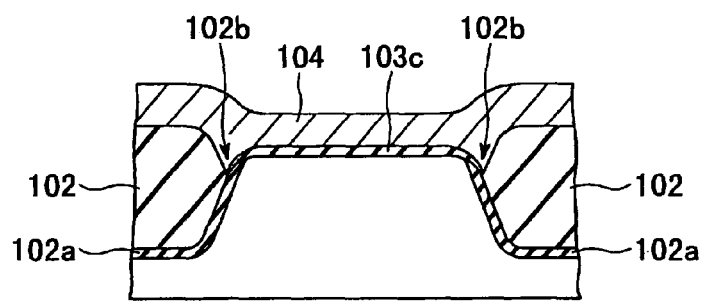
FIG. 8B is a sectional view of the semiconductor device shown in FIG. 8A cut along plane A-A'.

FIGS. 6A to 6C are sectional views for explaining a method for manufacturing a semiconductor device according to a fourth embodiment of the invention. The semiconductor device manufactured by the method for manufacturing a semiconductor device according to the present embodiment has a similar structure as the semiconductor device manufactured by the third embodiment, except that the semiconductor device has a MONOS nonvolatile memory in a third element region 1e. Hereinafter, identical numerals will be used for structures identical to those of the third embodiment, and the explanation thereof will be omitted.

First, as shown in FIG. 6A, a groove 1a and a thermally-oxidized film 2a are formed on a silicon substrate 1, and an element isolation film 2 is embedded in the groove 1a. The methods of forming these are the same as those of the first embodiment. In the present embodiment, the element isolation film 2 separates a first element region 1c, a second element region 1d and the third element region 1e, respectively, from other regions.

Next, a thermally-oxidized film 21 is formed through thermal oxidization of the silicon substrate 1. Next, a silicon nitride film 22 and a silicon oxide film 23 are laminated in this order on the element isolation film 2 and on the thermally-oxidized film 21 by CVD method. The thickness of the thermally-oxidized film 21 is, for example, not less than 1 nm and not more than 5 nm. Thickness of both the silicon nitride film 22 and the silicon oxide film 23 is, for example, not less than 2 nm and not more than 10 nm.

Next, the silicon substrate 1, the element isolation film 2, the thermally-oxidized film 21, the silicon nitride film 22 and the silicon oxide film 23 are thermally treated. As a result of this, nitrogen contained in the silicon nitride film 22 diffuses into a superficial surface of the element isolation film 2, and a silicon oxynitride layer 2b is formed on the surface of the element isolation film 2. Since the diffusion speed of nitrogen in the thermally-oxidized film 21 is lower than the diffusion speed of nitrogen in the element isolation film 2 formed by vapor-phase synthesis method, a nitrided layer is not formed on the surface of the silicon substrate 1.

Next, as shown in FIG. 6B, a resist pattern (which is not shown) is formed on the silicon oxide film 23, and the silicon oxide film 23, the silicon nitride film 22 and the thermally-oxidized film 21 are etched in this order using the resist pattern as mask. As a result of this, the silicon oxide film 23, the silicon nitride film 22 and the thermally-oxidized film 21 are removed except the section which serves as a storage section 24 of the MONOS nonvolatile memory. Subsequently, the resist pattern is removed.

Next, as shown in FIG. 6C, a gate insulating film 3c of a first transistor and a gate insulating film 3d of a second transistor are formed. The methods of forming these are the same as those of the third embodiment. Furthermore, as is the case with the third embodiment, formation of a concave section on the silicon substrate located 1 around the element isolation film 2 is suppressed in the first element region 1c. In addition, a threshold voltage of the first transistor is suppressed from dropping in the section located in the vicinity of the element isolation film 2. In this process, a thermally-oxidized film (which is not shown) is formed also in a region of the silicon substrate 1 located in the third element region 1e in which the storage section 24 of the MONOS nonvolatile memory is not formed.

Next, the gate insulating films 3c, 3d are formed. The methods of forming these are the same as those of the third embodiment. Next, a resist film (which is not shown) is formed on the third element region 1e and on the element isolation film 2 located around it. Next, an impurity is introduced into the silicon substrate 1 using the resist film, the gate electrodes 4c, 4d and the element isolation film 2 as mask. As a result of this, a low-concentration impurity region 6c is formed on the silicon substrate 1 located in the first element region 1c, and a low-concentration impurity region 6d is formed on the silicon substrate 1 located in the second element region 1d. Subsequently, the resist film is removed.

Next, a resist film (which is not shown) is formed on the first element region 1c, on the second element region 1d, and on the element isolation film 2 located around them. Next, an impurity is introduced into the silicon substrate 1 using the resist film and the storage section 24 as mask. As a result of this, a low-concentration impurity region 6e is formed on the silicon substrate 1 located in the third element region 1e. Subsequently, the resist film is removed.

Next, an insulating film is formed on the entire surface including on the gate electrodes 4c, 4d, and on the storage section 24, respectively, and then the insulating film is etched back. As a result of this, side walls 5c, 5d, 5e are respectively formed on the side walls of the gate electrodes 4c, 4d and of the storage section 24. In this process, the thermally-oxidized film formed in the third element region 1e is removed.

Next, an impurity is introduced into the silicon substrate 1 using the side walls 5c, 5d, 5e, the gate electrodes 4c, 4d, the storage section 24 and the element isolation film 2 as mask. As a result of this, impurity regions 7c, 7d are formed. In addition, an impurity region 7e which will serve as source and drain of the MONOS nonvolatile memory is formed on the silicon substrate 1 located in the third element region 1e.

In this way, the first and the second transistors and the MONOS nonvolatile memory are formed on the silicon substrate 1.

The present embodiment can also provide the same advantageous effects as the third embodiment. Furthermore, since the silicon oxynitride layer 2b is formed using the silicon nitride film 23 which will serve as the storage section 24 of the MONOS nonvolatile memory, there is no need to form a silicon nitride film only for the purpose of forming the silicon oxynitride layer 2b. Therefore, increase in the number of the processes can be suppressed.

The invention is not limited to the embodiments as described above, and various modifications are possible within the scope of the summary of the invention. For example, in each of the embodiments as described above, the invention may have a process of thermally treating the element isolation film 2 in an atmosphere containing ammonium after the element isolation film 2 is formed and before the silicon nitride films 12, 22 are formed on the element isolation film 2. The thermal treatment temperature is, for example, not lower than 600° C. and not higher than 700° C. Such modification nitrides the surface of the element isolation film 2, which facilitate permeation of nitrogen from the silicon nitride films 12, 22.

What is claimed is:

1. A method for manufacturing a semiconductor device, comprising:
    forming a groove in a semiconductor substrate and embedding an element isolation film made of a silicon oxide film in the groove;
    forming a silicon nitride film on the element isolation film;
    forming a silicon oxynitride layer on the surface of the element isolation film through thermal treatment of the element isolation film and the silicon nitride film; and
    removing the silicon nitride film.

2. The method for manufacturing a semiconductor device according to claim 1, in embedding the element isolation film, a first element region in which a first transistor is formed and a second element region in which a second transistor having a higher drive voltage than the first transistor is formed being separated from each other, the method further comprising, subsequent to removing the silicon nitride film:

forming a gate insulating film of the second transistor on the silicon substrate located in the second element region and forming a thermally-oxidized film on the silicon substrate located in the first element region through thermal oxidation of the surface of the silicon substrate;

removing the thermally-oxidized film by wet etching; and increasing the thickness of the gate insulating film of the second transistor located in the second element region and forming a gate insulating film of the first transistor on the silicon substrate located in the first element region, through thermal oxidation of the surface of the silicon substrate.

3. A method for manufacturing a semiconductor device, comprising:

forming a groove in a silicon substrate and embedding an element isolation film made of a silicon oxide film formed by a vapor-phase synthesis method in the groove;

forming a thermally-oxidized film on the surface of the silicon substrate;

forming a silicon nitride film on the thermally-oxidized film and on the element isolation film;

forming a silicon oxynitride layer on the surface of the element isolation film through thermal treatment of the element isolation film and the silicon nitride film; and removing the silicon nitride film.

4. The method for manufacturing a semiconductor device according to claim 3, in embedding the element isolation film, a first element region in which a first transistor is formed and a second element region in which a second transistor having a higher drive voltage than the first transistor is formed being separated from each other, the method further comprising, subsequent to removing the silicon nitride film:

removing the thermally-oxidized film;

forming a gate insulating film of the second transistor on the silicon substrate located in the second element region and forming a second thermally-oxidized film on the silicon substrate located in the first element region through thermal oxidation of the surface of the silicon substrate;

removing the second thermally-oxidized film by wet etching; and increasing the thickness of the gate insulating film of the second transistor located in the second element region and forming a gate insulating film of the first transistor on the silicon substrate located in the first element region, through thermal oxidation of the surface of the silicon substrate.

5. The method for manufacturing a semiconductor device according to claim 1, further comprising, between embedding the element isolation film and forming the silicon nitride film, thermal treating the element isolation film in an atmosphere containing ammonium.

* * * * *